United States Patent
Ma

(10) Patent No.: US 7,194,043 B2
(45) Date of Patent: Mar. 20, 2007

(54) SYSTEM AND METHOD FOR PREDISTORTING A SIGNAL TO REDUCE OUT-OF-BAND ERROR

(75) Inventor: Zhengxiang Ma, Summit, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 745 days.

(21) Appl. No.: 10/159,657

(22) Filed: May 31, 2002

(65) Prior Publication Data
US 2003/0223509 A1 Dec. 4, 2003

(51) Int. Cl.
*H04L 25/03* (2006.01)
*H03F 1/26* (2006.01)

(52) U.S. Cl. ........................ 375/296; 330/149

(58) Field of Classification Search ........ 375/254, 375/385, 295–297; 330/149; 455/114.3
See application file for complete search history.

(56) References Cited

U.S. PATENT DOCUMENTS

| | | | | |
|---|---|---|---|---|
| 6,246,286 B1 * | 6/2001 | Persson | ...................... | 330/149 |
| 6,275,103 B1 * | 8/2001 | Maniwa | ...................... | 330/149 |
| 6,496,062 B1 * | 12/2002 | Nitz et al. | ..................... | 330/52 |
| 6,522,198 B2 * | 2/2003 | Ahn | ........................... | 330/149 |
| 6,552,609 B2 * | 4/2003 | Hamada et al. | ............. | 330/149 |
| 6,711,217 B1 * | 3/2004 | Jeong | ......................... | 375/297 |
| 6,907,085 B2 * | 6/2005 | Kubo et al. | .................. | 375/285 |
| 6,928,122 B2 * | 8/2005 | Opas et al. | .................. | 375/296 |
| 2003/0179830 A1 * | 9/2003 | Eidson et al. | ............... | 375/296 |

OTHER PUBLICATIONS

U.S. Appl. No. 09/915,042, filed Jul. 25, 2001, C.R. Giardina et al., "System and Method for Predistorting a Signal Using Current and Past Signal Samples."
U.S. Appl. No. 09/928,628, Aug. 13, 2001, C.R. Giardina et al., "Multiple Stage and/or Nested Predistortion System and Method."

* cited by examiner

*Primary Examiner*—Young T. Tse

(57) ABSTRACT

A predistortion system uses spectral regrowth filtering in a feedback path thereof to reduce out-of-band error. An illustrative embodiment of the system includes a predistortion circuit which generates a predistorted signal, one or more signal processing elements configured to process the predistorted signal, and a feedback processing circuit coupled between an output of the one or more signal processing elements and a control input of the predistortion circuit. Associated with the feedback processing circuit is at least one spectral regrowth filter. The spectral regrowth filter is configured to pass an out-of-band portion of a feedback signal while attenuating an in-band portion of the feedback signal, and operates in conjunction with the feedback processing circuit to control one or more characteristics of the predistortion circuit.

20 Claims, 3 Drawing Sheets

SYSTEM AND METHOD FOR PREDISTORTING A SIGNAL TO REDUCE OUT-OF-BAND ERROR

RELATED APPLICATION(S)

The present invention is related to the inventions described in U.S. patent application Ser. No. 10/159,629, entitled "Signal Predistortion Using a Combination of Multiple Predistortion Techniques," now issued as U.S. Pat. No. 6,794,939, and U.S. patent application Ser. No. 10/159,540 entitled "System and Method for Predistorting a Signal Using Current and Past Signal Samples," both filed concurrently herewith and hereby incorporated by reference herein.

FIELD OF THE INVENTION

The present invention relates generally to signal processing, and more particularly to signal predistortion techniques for use in conjunction with power amplification or other nonlinear processing operations in a wireless communication system or other type of system.

BACKGROUND OF THE INVENTION

As is well known, signal predistortion techniques are used in conjunction with power amplification in order to correct for undesirable effects, such as output signal distortion, spectral regrowth and adjacent channel power (ACP), that are typically associated with amplifier nonlinearity at high output power levels. In general, predistortion techniques involve distorting an input signal prior to amplification in a manner that takes into account the transfer function characteristics of the amplifier, such that the nonlinearity-related effects are at least partially canceled out in the resulting output signal.

Recently-developed signal predistortion techniques which overcome one or more problems associated with conventional techniques are described in U.S. patent application Ser. No. 09/915,042, filed Jul. 25, 2001 and entitled "System and Method for Predistorting a Signal Using Current and Past Signal Samples," and U.S. patent application Ser. No. 09/928,628, filed Aug. 13, 2001 and entitled "Multiple Stage and/or Nested Predistortion System and Method," now issued as U.S. Pat. No. 6,931,080, both of which are hereby incorporated by reference herein.

Despite the considerable advances provided by the predistortion techniques described in the above-cited U.S. patent application Ser. Nos. 09/915,042 and 09/928,628, a need remains for further improvements in predistortion techniques, so as to provide additional performance enhancements in wireless communication systems and other systems employing power amplification.

SUMMARY OF THE INVENTION

The present invention provides improved signal predistortion through the use of spectral regrowth filtering in a feedback path of a predistortion system. Advantageously, the spectral regrowth filtering substantially reduces out-of-band error, thereby improving the performance of the predistortion system.

In accordance with one aspect of the invention, a predistortion system includes a predistortion circuit which generates a predistorted signal, an amplifier or other set of one or more signal processing elements configured to process the predistorted signal, and a feedback processing circuit coupled between an output of the one or more signal processing elements and a control input of the predistortion circuit. Associated with the feedback processing circuit is at least one spectral regrowth filter. The spectral regrowth filter is configured to pass an out-of-band portion of a feedback signal while attenuating an in-band portion of the feedback signal, and operates in conjunction with the feedback processing circuit to control a set of filter coefficients or one or more other characteristics of the predistortion circuit. The in-band portion of the feedback signal corresponds substantially to a portion of the feedback signal within a carrier bandwidth of the system.

In an illustrative embodiment of the invention, the spectral regrowth filter implements the following equation:

$$c(n) = \sum_{k=0}^{K} b(n-k) \cdot h(k),$$

where b(n) denotes the filter input, c(n) denotes the filter output, and h(k) for k=0, 1, 2, ... K denote filter coefficients.

In accordance with another aspect of the invention, the feedback processing circuit includes the spectral regrowth filter as a first spectral regrowth filter and further includes a second spectral regrowth filter and a second predistortion circuit. The second predistortion circuit receives as an input the feedback signal and generates a corresponding output for application to an input of the first spectral regrowth filter. The second spectral regrowth filter receives as an input the predistorted signal. Outputs of the first and second spectral regrowth filters are applied to corresponding inputs of a signal combiner which is configured to generate a difference signal for controlling the one or more characteristics of the first predistortion circuit.

These and other features and advantages of the present invention will become more apparent from the accompanying drawings and the following detailed description.

DETAILED DESCRIPTION OF THE INVENTION

The present invention will be illustrated below in conjunction with exemplary predistortion techniques and associated circuitry particularly well-suited for use in a base station of a wireless communication system. It should be understood, however, that the invention is not limited to use with any particular type of predistortion circuit or nonlinear system application, but is instead more generally applicable to any application which can benefit from the improved predistortion techniques of the invention.

Figure 1:
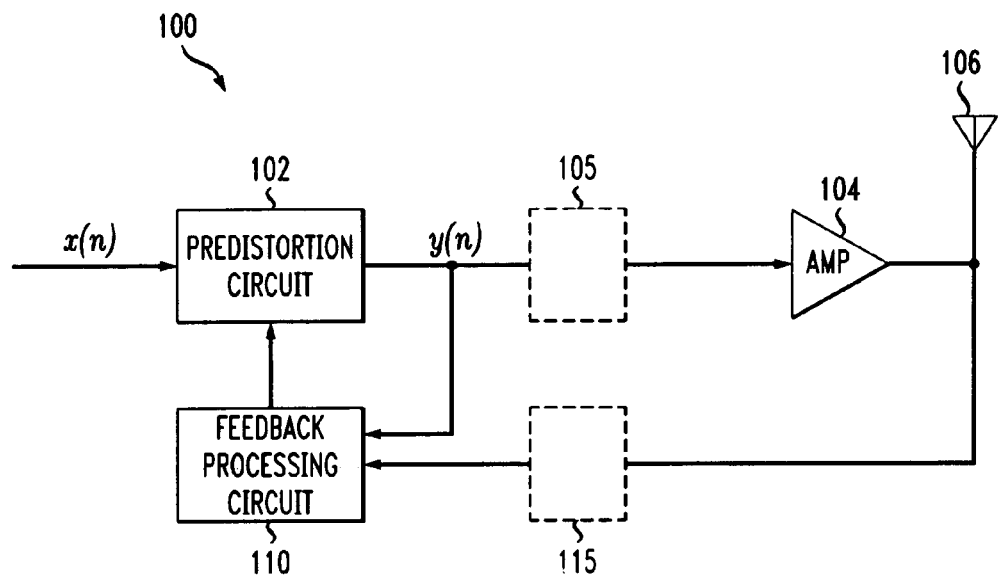
FIG. 1 shows a simplified diagram of a portion of a communication system in which the present invention may be implemented.

FIG. 1 shows a simplified block diagram of a portion of a communication system 100 in which the present invention may be implemented. The portion of the system 100 shown in the figure may correspond, for example, to one or more signal transmission channels of a wireless communication system base station.

The portion of the system 100 as shown includes a predistortion circuit 102 coupled to an amplifier 104. An input signal x(n) applied to an input of the predistortion circuit is predistorted therein to generate a predistorted output signal y(n). The predistorted signal y(n) is generally subject to further processing before the resulting processed signal is applied to an input of the amplifier 104. These operations are collectively denoted by the dashed box 105 in the figure, and may include, by way of example and not limitation, operations such as digital-to-analog conversion, upconversion and filtering. Such operations are well-known to those skilled in the art, and are therefore not described in further detail herein. It is to be appreciated that the invention does not require the performance of any particular operation or set of operations in box 105, although any operations implemented therein clearly should have sufficient bandwidth to accommodate the predistorted signal.

The amplifier 104 amplifies the processed signal applied to its input and the resulting output signal is transmitted via an antenna 106 of the system 100. The output of the amplifier 104 is coupled via a predistortion feedback path to a feedback processing circuit 110 which processes the amplifier output signal to generate information utilized by the predistortion circuit 102. The amplifier output may be further processed before being supplied to the input of the feedback processing circuit 110, using one or more operations collectively illustrated as dashed box 115 in the figure. Such operations are generally complementary to those performed in box 105, and thus may include filtering, downconversion, analog-to-digital conversion, and so on, and are configured with an appropriate bandwidth for implementing the predistortion feedback. The feedback processing circuit 110 is configured to generate information such as updated lookup table entries or predistortion polynomial coefficients for use by the predistortion circuit 102.

In the embodiment of FIG. 1, the predistorted output signal y(n) is also applied to an input of the feedback processing circuit 110, so as to be available for use in coefficient updating or other feedback processing operations implemented in circuit 110. However, this connection may be eliminated in other embodiments.

The present invention in the illustrative embodiments thereof as described herein provides feedback processing which utilizes spectral regrowth filtering to reduce out-of-band error associated with a predistorted signal. This feedback processing will be described in greater detail below with reference to FIGS. 2A, 2B, 3 and 4. The feedback processing may also make use of operations such as those described in the above-cited U.S. patent application Ser. Nos. 09/915,042 and 09/928,628, as well as other feedback processing operations known in the art.

It is to be appreciated that the portion of the system 100 shown in FIG. 1 is simplified for clarity of illustration, and represents an example of one configuration of system elements that may utilize the techniques of the invention. Those skilled in the art will recognize that the predistortion techniques of the invention can be implemented in systems having other arrangements of signal processing and transmission elements. Moreover, the predistortion techniques of the invention can be implemented at baseband, intermediate frequency (IF) or radio frequency (RF), or using combinations of these frequency ranges, and so one or more of the input signal x(n) and the predistorted signal y(n) may represent baseband, IF or RF signals. Moreover, the techniques can be implemented in the digital or analog domains or in combinations thereof, although it should be noted in this regard that digital implementation is generally preferred in that it typically results in less complexity for predistortion operations such as polynomial generation.

The spectral regrowth filtering aspects of the invention will initially be described with reference to a theoretical model of an amplifier system. For simplicity, the model is described in the analog domain, but those skilled in the art will readily appreciate its applicability to predistortion in the digital domain.

The memoryless behavior of the amplifier can be modeled as a power series of the input amplitude, as follows:

$$y(t) = x(t) \cdot \sum_{k=0}^{n} a_k \cdot |x(t)|^k \qquad (1)$$

where y(t) and x(t) are the output and input waveforms, respectively, of the amplifier, and $a_k$ is the coefficient for kth power of the input amplitude $|x(t)|$. By minimizing the mean square error of the estimate $$\sum_t \left| y(t) - x(t) \cdot \sum_{k=0}^{n} a_k \cdot |x(t)|^k \right|^2$$

with respect to all complex conjugates of $a_m$ (m=1, . . . , n), one can obtain a set of n linear equations to solve for the complex coefficients:

$$\sum_t \left( y(t) - x(t) \cdot \sum_{k=0}^{n} a_k \cdot |x(t)|^k \right) \cdot \mathrm{conj}(x(t)) \cdot |x(t)|^m = 0, \qquad (2)$$

where conj( ) is the complex conjugate function. This technique yields a result substantially equivalent to that which would be obtained by a polynomial fitting approach.

The present invention is based at least in part on the recognition that the distortion of greatest interest is primarily that distortion which causes spectral regrowth outside of the carrier bandwidth, also referred to herein as "out-of-band error." Therefore, one can significantly improve performance by weighting the above-described minimum mean square error (MMSE) estimate in the frequency domain so as to emphasize the error outside of the carrier bandwidth, such that this out-of-band error is reduced in the predistortion system.

As one example, such a weighting can be provided using a finite impulse response (FIR) filter h that has a particular passband characteristic over the frequency range of interest for spectral regrowth. More particularly, minimizing the quantity:

$$\sum_t \left| h * y(t) - \sum_{k=0}^{n} a_k \cdot h * (x(t) \cdot |x(t)|^k) \right|^2, \quad (3)$$

where * denotes convolution, results in the following set of linear equations that can be solved for the filter coefficients:

$$\sum_t \left( h * y(t) - \sum_{k=0}^{n} a_k \cdot h * (x(t) \cdot |x(t)|^k) \right) \cdot \operatorname{conj}(h * (x(t) \cdot |x(t)|^m)) = 0. \quad (4)$$

Advantageously, a filter of this type can significantly improve the performance of the predistortion system of FIG. 1. Further improvements can be provided by using a predistortion model which takes amplifier memory effect into account in the manner described in the above-cited U.S. Patent Applications filed concurrently herewith.

Figure 2A:
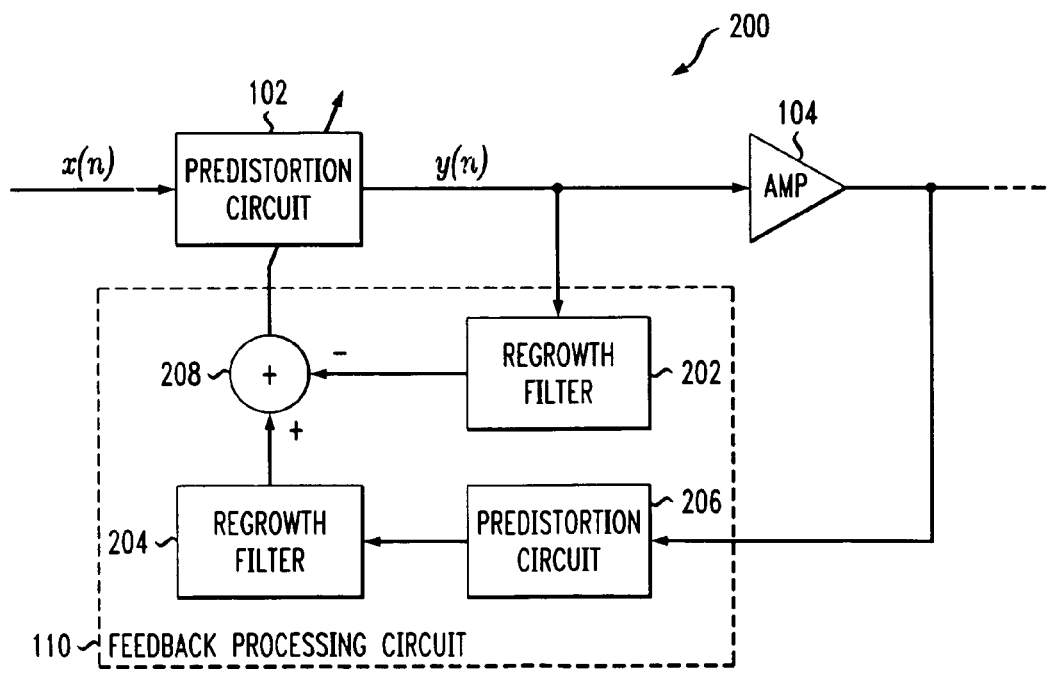
FIGS. 2A and 2B show more detailed views of illustrative embodiments of the FIG. 1 system, with spectral regrowth filtering for reducing out-of-band error in accordance with the techniques of the invention.

FIG. 2A shows a predistortion system 200 which corresponds to one possible implementation of the FIG. 1 system. In the system of FIG. 2A, one or more parameters of the predistortion circuit are estimated directly. The system 200 includes the predistortion circuit 102, the amplifier 104, and the feedback processing circuit 110 of the FIG. 1 system. Elements 105 and 115 of the FIG. 1 system are assumed to be straight-through connections for simplicity and clarity of illustration. The feedback processing circuit 110 of the system 200 incorporates an illustrative embodiment of the above-described spectral regrowth filtering for reducing out-of-band error in accordance with the techniques of the invention. More particularly, the feedback processing circuit 110 includes a first spectral regrowth filter 202, a second spectral regrowth filter 204, a predistortion circuit 206, and a signal combiner 208. The frequency characteristics of the first and second spectral regrowth filters 202, 204 are preferably substantially the same.

The first spectral regrowth filter 202 receives as an input in this embodiment the predistorted output signal y(n) from the predistortion circuit 102, and the resulting filtered version thereof is applied to one input of the signal combiner 208. The output of the amplifier 104 is fed back to an input of the predistortion circuit 206. The predistortion circuit 206 preferably has substantially the same signal predistortion characteristics as the predistortion circuit 102. In one possible implementation of the system 200, the predistortion circuit 102 is implemented at least in part in hardware, while the predistortion circuit 206 is implemented substantially in software and configured to replicate the signal processing operations of the predistortion circuit 102.

The output of the predistortion circuit 206 is applied to an input of the second spectral regrowth filter 204. The output of the second spectral regrowth filter 204 is applied to a second input of the signal combiner 208. The signal combiner 208 takes the difference of its two inputs, and the resulting difference signal is used to adjust one or more parameters of the predistortion circuit 102. More particularly, the difference signal may be used to update the coefficients utilized in the predistortion circuit 102, or to otherwise adjust the operation of the predistortion circuit 102 such that the difference signal is reduced. The particular manner in which the predistortion circuit operation is adjusted by the feedback processing circuit may be based on predistortion techniques involving operations such as polynomial generation or coefficient table lookup, such as those described in one or more of the above-cited U.S. Patent Applications.

Although not specifically shown in FIG. 2A, the output of the signal combiner 208 should also be used to adjust the predistortion circuit 206 as well as predistortion circuit 102. In this manner, the predistortion circuit 206 will continue to replicate the signal processing operations of the predistortion circuit 102, as indicated previously. The predistortion circuits 102 and 206 may thus be viewed as being "slaved together" in their operation.

In other embodiments, the difference signal may be further processed in the feedback processing circuit 110, with particular coefficients or other predistortion update information supplied to the predistortion circuit 102 in place of or in addition to adjustment based the difference signal itself.

Figure 2B:
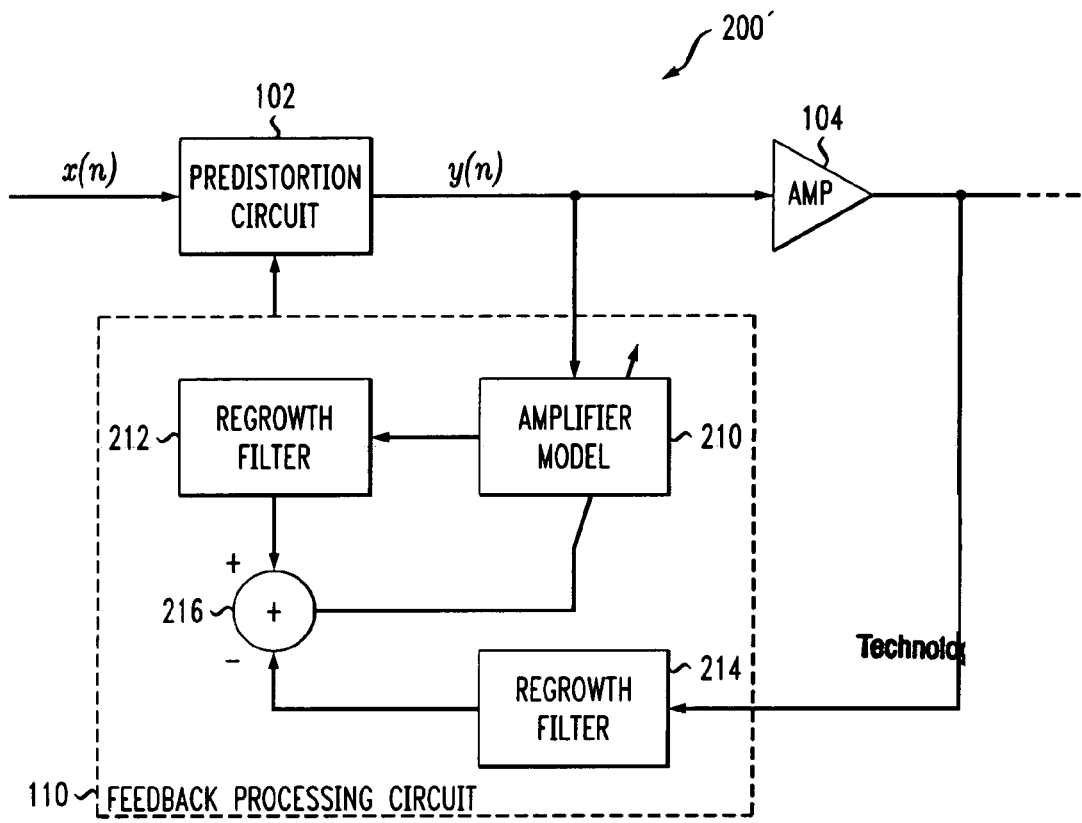

As indicated previously, one or more predistortion circuit parameters are directly estimated in the FIG. 2A embodiment. FIG. 2B shows an alternative embodiment in which the parameters of an amplifier model are first estimated, and then used to generate one or more predistortion parameters. The system 200' in FIG. 2B includes predistortion circuit 102, amplifier 104 and feedback processing circuit 110 as previously described. Again, elements 105 and 115 of the FIG. 1 system are assumed to be straight-through connections for simplicity and clarity of illustration. The feedback processing circuit 110 of the system 200' includes an amplifier model 210, a first spectral regrowth filter 212, a second spectral regrowth filter 214, and a signal combiner 208. The frequency characteristics of the first and second spectral regrowth filters 212, 214 are preferably substantially the same.

The amplifier model 210 receives as an input in this embodiment the predistorted output signal y(n) from the predistortion circuit 102, and the output of the amplifier model 210 is applied to an input of the first spectral regrowth filter 212. The resulting output of the filter 212 is applied to one input of the signal combiner 216. The output of the amplifier 104 is fed back to an input of the second spectral regrowth filter 214. The resulting output of the filter 214 is applied to another input of the signal combiner 216. The signal combiner 216 takes the difference of its two inputs, and the resulting difference signal is used to adjust one or more parameters of the amplifier model 210. The amplifier model 210 models the performance of the amplifier 104, and may be of a type described in one or more of the above-cited U.S. Patent Applications. The parameters of the amplifier model 210 as determined by the feedback processing circuit 110 may be used to update or to otherwise adjust the operation of the predistortion circuit 102, as described in conjunction with FIG. 1, such that the difference signal is reduced.

Although the filters 202 and 204 in FIG. 2A and the filters 212 and 214 in FIG. 2B are shown as separate filters, it is to be appreciated that a single processing element may be used to implement both filters in a given filter pair.

Figure 3:
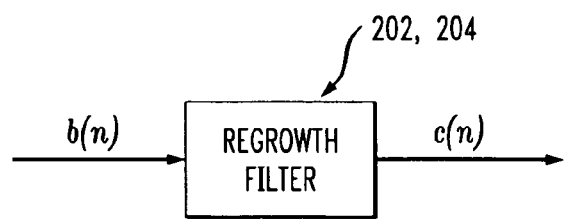
FIG. 3 shows a particular one of the spectral regrowth filters of the FIG. 2A or FIG. 2B system.

FIG. 3 shows a particular one of the spectral regrowth filters 202, 204, 212 or 214 of the FIG. 2A or FIG. 2B system. The spectral regrowth filter receives an input b(n) and generates an output c(n). The filter in this embodiment may be an FIR filter that implements the following equation:

$$c(n) = \sum_{k=0}^{K} b(n-k) \cdot h(k), \quad (5)$$

where h(k) for k=0, 1, 2, . . . K denote the filter coefficients. As a more particular example, the coefficients h(k) for a filter implementation in which K=18 are as follows:

h(0)=0.0247
h(1)=0.1342
h(2)=0.0480
h(3)=0.0497
h(4)=0.0107
h(5)=−0.0406
h(6)=−0.0998
h(7)=−0.1545
h(8)=−0.1932
h(9)=0.7929
h(10)=−0.1932
h(11)=−0.1545
h(12)=−0.0998
h(13)=−0.0406
h(14)=0.0107
h(15)=0.0497
h(16)=0.0480
h(17)=0.1342
h(18)=0.0247

Figure 4:
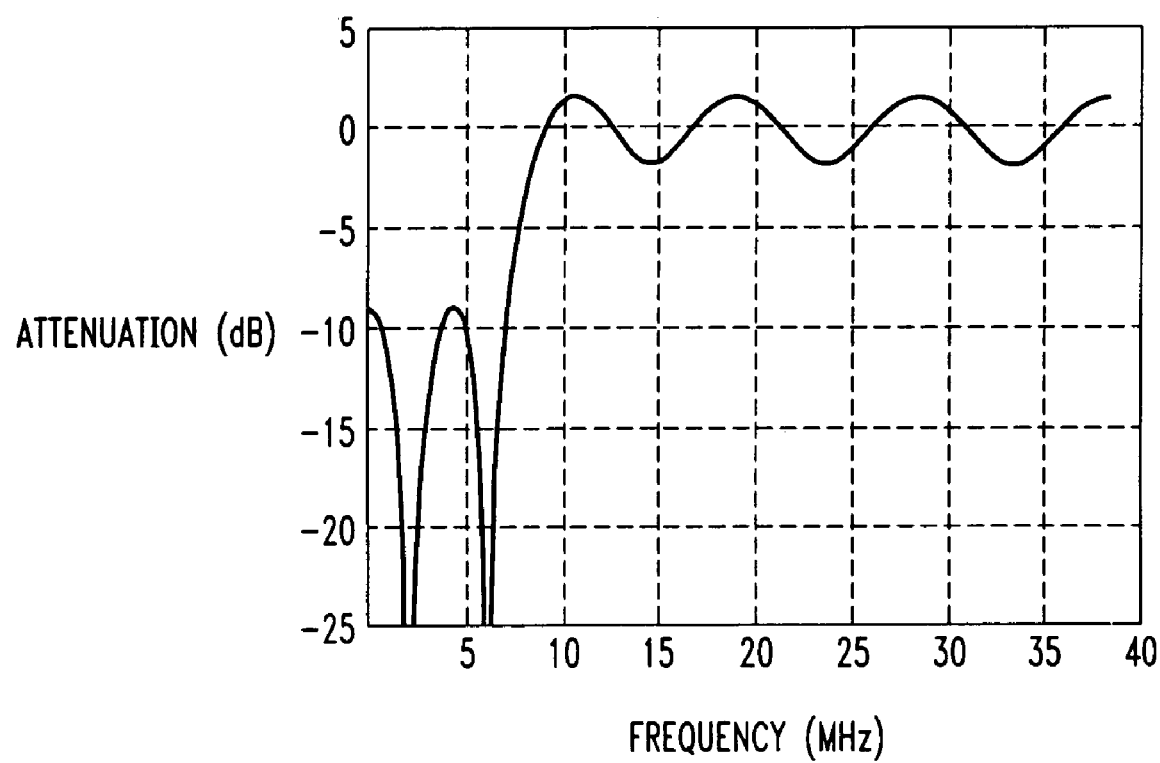
FIG. 4 is a plot of an example frequency characteristic for a spectral regrowth filter in accordance with the invention.

A plot of the corresponding frequency characteristic for a spectral regrowth filter having the above coefficients is shown in FIG. 4. The plot shows the frequency characteristic in terms of attenuation in decibels (dB) as a function of frequency in megahertz (MHz). It can be seen that the filter attenuates a carrier bandwidth portion of the spectrum, in this case corresponding to the portion of the spectrum less than about 7.5 MHz, while passing the out-of-band portion of the spectrum, in this case corresponding to the portion of the spectrum greater than about 10 MHz. This example spectral regrowth filter may be used for both filter 202 and filter 204 in the FIG. 2A system, and for both filter 212 and filter 214 in the FIG. 2B system. It is to be appreciated, however, that other types of spectral regrowth filters may also be used to implement a reduction in out-of-band error in accordance with the techniques of the invention. It should also be understood that the particular passband characteristics of the FIG. 4 filter will be selected to accommodate a particular amplifier output signal configuration, taking into account any signal translation operations such as upconversion and downconversion that were eliminated from FIGS. 1, 2A and 2B for simplicity of illustration.

As indicated above, the term "out-of-band" as used herein refers generally to the portion of the amplifier output signal outside of the carrier bandwidth. This will generally vary depending upon the particular specifications of the air interface of the system. For example, in an IS-95 CDMA system, a typical power amplifier output signal will include a total of 11 carriers occupying a total carrier bandwidth of about 15 MHz.

The above-described embodiments of the invention are intended to be illustrative only. For example, although each of the FIG. 2A and FIG. 2B embodiments utilizes a pair of spectral regrowth filters, the invention can be implemented using more or fewer spectral regrowth filters. The particular filtering and signal processing arrangements shown are by way of example, and other arrangements may be used in alternative embodiments of the invention. In addition, the predistortion techniques of the invention can be implemented in hardware, software, firmware or combinations thereof. These and numerous other alternative embodiments within the scope of the following claims will be readily apparent to those skilled in the art.

We claim:

1. A predistortion system comprising:
   a predistortion circuit adapted to receive an input signal, the predistortion circuit being configured to generate a corresponding predistorted signal at an output thereof,
   one or more signal processing elements configured to process the predistorted signal;
   a feedback processing circuit coupled between an output of the one or more signal processing elements and a control input of the predistortion circuit; and
   at least one spectral regrowth filter associated with the feedback processing circuit and configured to pass a first portion of a feedback signal while attenuating a second portion of the feedback signal, the spectral regrowth filter operating in conjunction with the feedback processing circuit to control one or more characteristics of the predistortion circuit;
   wherein the feedback processing circuit has a first input for receiving the predistorted signal and a second input for receiving the feedback signal from the output of the one or more signal processing elements, the feedback processing circuit generating a difference signal indicative of differences between the predistorted signal and the feedback signal.

2. The system of claim 1 wherein the one or more signal processing elements comprises an amplifier, the feedback processing circuit being coupled between an output of the amplifier and the control input of the predistortion circuit.

3. The system of claim 1 wherein the one or more characteristics of the predistortion circuit comprise at least one set of coefficients associated with the predistortion circuit.

4. The system of claim 1 wherein the spectral regrowth filter is configured to pass an out-of-band portion of the feedback signal while attenuating an in-band portion of the feedback signal, wherein the in-band portion of the feedback signal corresponds substantially to a portion of the feedback signal within a carrier bandwidth of the system.

5. The system of claim 1 wherein the spectral regrowth filter comprises a digital filter implementing the following equation:

$$c(n) = \sum_{k=0}^{K} b(n-k) \cdot h(k),$$

where b(n) denotes an input of the digital filter, c(n) denotes an output of the digital filter, and h(k) for k=0,1, 2,. . . K denote coefficients of the digital filter.

6. The system of claim 1 where in the predistortion circuit comprises a memoryless predistortion circuit.

7. The system of claim 1 wherein the predistortion circuit is configured to process one or more past time spaced input samples.

8. A predistortion system comprising:
   a predistortion circuit adapted to receive an input signal the predistortion circuit being configured to generate a corresponding predistorted signal at an output thereof;

one or more signal processing elements configured to process the predistorted signal;

a feedback processing circuit coupled between an output of the one or more signal processing elements and a control input of the predistortion circuit; and at least one spectral regrowth filter associated with the feedback processing circuit and configured to pass a first portion of a feedback signal while attenuating a second portion of the feedback signal, the spectral regrowth filter operating in conjunction with the feedback processing circuit to control one or more characteristics of the predistortion circuit;

wherein the predistortion circuit comprises a first predistortion circuit, and the feedback processing circuit comprises the spectral regrowth filter as a first spectral regrowth filter and further comprises a second spectral regrowth filter and a second predistortion circuit, the second predistortion circuit receiving as an input the feedback signal and generating a corresponding output for application to an input of the first spectral regrowth filter, the second spectral regrowth filter receiving as an input the predistorted signal, and wherein outputs of the first and second spectral regrowth filters are applied to corresponding inputs of a signal combiner which is configured to generate a difference signal for controlling the one or more characteristics of the first predistortion circuit.

9. A predistortion system comprising:

a predistortion circuit adapted to receive an input signal, the predistortion circuit being configured to generate a corresponding predistorted signal at an output thereof;

one or more signal processing elements configured to process the predistorted signal;

a feedback processing circuit coupled between an output of the one or more signal processing elements and a control input of the predistortion circuit; and at least one spectral regrowth filter associated with the feedback processing circuit and configured to pass a first portion of a feedback signal while attenuating a second portion of the feedback signal, the spectral regrowth filter operating in conjunction with the feedback processing circuit to control one or more characteristics of the predistortion circuit;

wherein the feedback processing circuit comprises the spectral regrowth filter as a first spectral regrowth filter and further comprises a second spectral regrowth filter and an amplifier model element, the second spectral regrowth filter receiving as an input the feedback signal and generating a corresponding output for application to an input of a signal combiner, the amplifier model element receiving as an input the predistorted signal and generating an output for application to an input of the first spectral regrowth filter, the output of the first spectral regrowth filter being applied to another input of the signal combiner, the signal combiner being configured to generate a difference signal for controlling one or more parameters of the amplifier model element, the one or more parameters of the amplifier model element being used to control the one or more characteristics of the predistortion circuit.

10. An article of manufacture comprising a machine-readable storage medium for storing one or more programs for use in predistorting a signal in a predistortion system, the predistortion system comprising a predistortion circuit for processing an input signal to generate a predistorted signal, the predistorted signal being applied to one or more signal processing elements, wherein the one or more programs when executed implement the step of:

filtering a feedback signal from an output of the one or more signal processing elements in a spectral regrowth filter associated with a feedback processing circuit, the spectral regrowth filter being configured to pass a first portion of the feedback signal while attenuating a second portion of the feedback signal, the spectral regrowth filter operating in conjunction with the feedback processing circuit to control one or more characteristics of the predistortion circuit;

wherein the feedback processing circuit has a first input for receiving the predistorted signal and a second input for receiving the feedback signal from the output of the one or more signal processing elements, the feedback processing circuit generating a difference signal indicative of differences between the predistorted signal and the feedback signal.

11. An apparatus for use in a predistortion system having a predistortion circuit adapted to receive an input signal, the predistortion circuit being configured to generate a corresponding predistorted signal at an output thereof, and one or more signal processing elements configured to process the predistorted signal, the apparatus comprising:

a feedback processing circuit coupled between an output of the one or more signal processing elements and a control input of the predistortion circuit, the feedback processing circuit having associated therewith at least one spectral regrowth filter configured to pass a first portion of a feedback signal while attenuating a second portion of the feedback signal, the spectral regrowth filter operating in conjunction with the feedback processing circuit to control one or more characteristics of the predistortion circuit;

wherein the feedback processing circuit has a first input for receiving the predistorted signal and a second input for receiving the feedback signal from the output of the one or more signal processing elements, the feedback processing circuit generating a difference signal indicative of differences between the predistorted signal and the feedback signal.

12. The apparatus of claim 11 wherein the one or more signal processing elements comprises an amplifier, the feedback processing circuit being coupled between an output of the amplifier and the control input of the predistortion circuit.

13. The apparatus of claim 11 wherein the one or more characteristics of the predistortion circuit comprise at least one set of coefficients associated with the predistortion circuit.

14. The apparatus of claim 11 wherein the spectral regrowth filter is configured to pass an out-of-band portion of the feedback signal while attenuating an in-band portion of the feedback signal, wherein the in-band portion of the feedback signal corresponds substantially to a portion of the feedback signal within a carrier bandwidth of the system.

15. The apparatus of claim 11 wherein the predistortion circuit comprises a memoryless predistortion circuit.

16. In a predistortion system, a method for predistorting a signal, the method comprising the steps of:

processing an input signal in a predistortion circuit to generate a predistorted signal;

applying the predistorted signal to one or more signal processing elements; and filtering a feedback signal from an output of the one or more signal processing elements in a spectral regrowth filter associated with a feedback processing circuit, the spectral regrowth filter being configured to pass a first portion of the feedback signal while attenuating a second portion of the feedback signal, the spectral regrowth filter operating in conjunction wit the feedback processing circuit to control one or more characteristics of the predistortion circuit;

wherein the feedback processing circuit has a first input for receiving the predistorted signal and a second input for receiving the feedback signal from the output of the one or more signal processing elements, the feedback processing circuit generating a difference signal indicative of differences between the predistorted signal and the feedback signal.

17. The method of claim 16 wherein the one or more signal processing elements comprises an amplifier, the feedback processing circuit being coupled between an output of the amplifier and the control input of the predistortion circuit.

18. The method of claim 16 wherein the one or more characteristics of the predistortion circuit comprise at least one set of coefficients associated with the predistortion circuit.

19. The method of claim 16 wherein the spectral regrowth filter is configured to pass an out-of band portion of the feedback signal while attenuating an in-band portion of the feedback signal, wherein the in-band portion of the feedback signal corresponds substantially to a portion of the feedback signal within a carrier bandwidth of the system.

20. The method of claim 16 wherein the predistortion circuit is configured to process one or more past time spaced input samples.

\* \* \* \* \*

UNITED STATES PATENT AND TRADEMARK OFFICE
CERTIFICATE OF CORRECTION

PATENT NO. : 7,194,043 B2
APPLICATION NO. : 10/159657
DATED : March 20, 2007
INVENTOR(S) : Zhengxiang Ma It is certified that error appears in the above-identified patent and that said Letters Patent is hereby corrected as shown below:

Claim 6, col. 8, line 58, please delete "where in" and insert --wherein--.

Claim 16, col. 11, line 7, please delete "wit" and insert --with--.

Signed and Sealed this

Twenty-ninth Day of May, 2007

JON W. DUDAS
*Director of the United States Patent and Trademark Office*